United States Patent [19]

Bruel

[11] Patent Number: 5,714,395
[45] Date of Patent: Feb. 3, 1998

[54] PROCESS FOR THE MANUFACTURE OF THIN FILMS OF SEMICONDUCTOR MATERIAL

[75] Inventor: Michel Bruel, Vevrey, France

[73] Assignee: Commissariat a l'Energie Atomique, Paris, France

[21] Appl. No.: 713,201

[22] Filed: Sep. 12, 1996

[30] Foreign Application Priority Data

Sep. 13, 1995 [FR] France .................................. 95 10718

[51] Int. Cl.$^6$ ................................................ H01L 21/265
[52] U.S. Cl. .................................................. 437/24; 437/974
[58] Field of Search ............................... 437/24, 20, 974, 437/62, 247, 26, 966; 148/DIG. 12

[56] References Cited

U.S. PATENT DOCUMENTS

| 4,368,083 | 1/1983 | Bruel et al. . | |
|---|---|---|---|
| 4,452,644 | 6/1984 | Bruel et al. . | |
| 5,141,894 | 8/1992 | Bisaro et al. | 437/24 |
| 5,143,858 | 9/1992 | Tomozane et al. | 437/24 |
| 5,198,371 | 3/1993 | Li | 437/24 |
| 5,374,564 | 12/1994 | Bruel | 437/24 |
| 5,494,835 | 2/1996 | Bruel | 437/24 |
| 5,559,043 | 9/1996 | Bruel . | |
| 5,585,304 | 12/1996 | Hayashi et al. | 437/62 |

FOREIGN PATENT DOCUMENTS 0 533 551   3/1993   European Pat. Off. .

OTHER PUBLICATIONS

IEEE Circuits and Devices Magazine, pp. 6–11, Jul. 1987, Hon Wai Lam, "Simox SOI for Integrated Circuit Fabrication".

Japanese Journal of Applied Physics, vol. 28, No. 8, pp. 1426–1443, Aug. 1989, J. Haisma, et al., "Silicon–on–Insulatior Wafer Bonding–Wafer Thinning Technological Evaluations".

J. Appl. Phys., vol. 64, No. 10, pp. 4943–4950, Nov. 15, 1988, W.P. Maszara, et al., "Bonding of Silicon Wafers for Silicon–on–Insulator".

1986 IEEE SOS/SOI Technology Workshop, 2 pages, Jul. 16, 1986, L.M. Mercandalli, et al., "CMOS/SOZ and CMOS/SOOZ: A Device–Quality MOS on Insulator Made on Zirconia Substrates".

Primary Examiner—John Niebling
Assistant Examiner—S. Mulpuri
Attorney, Agent, or Firm—Oblon, Spivak, McClelland, Maier & Neustadt, P.C.

[57] ABSTRACT

The process includes the following steps: implantation of ions (12) in a semi-conducting wafer (10), to create a cleavage layer of gaseous microblisters (16) in the wafer, heat treatment of the wafer, in order to cause separation of a surface layer (18) from the rest of the wafer, along the layer of microblisters. According to the invention, the implantation is carried out at a depth equal to or greater than a given minimum depth so that the thin film obtained is rigid, and so that the heat treatment can release it.

6 Claims, 1 Drawing Sheet

PROCESS FOR THE MANUFACTURE OF THIN FILMS OF SEMICONDUCTOR MATERIAL

DESCRIPTION

1. Technical Field

This invention relates to a process for the manufacture of thin films made of a semiconductor material, and particularly monocrystalline films.

This type of film is used in many applications in microelectronic fields. For example, they are used for the manufacture of substrates, such as silicon substrates on an insulator, for the production of membranes, for the production of masks such as those used for example in X-ray lithography techniques, and for the manufacture of integrated circuits with several active layers.

2. State of Prior Art

It is known that there are several methods and processes for making thin monocrystalline semiconductor films, and that these methods are often complex and expensive to implement. Although it is relatively easy to make films of a polycrystalline or amorphous material, it is much more difficult to make monocrystalline films.

Methods of making monocrystalline films include some of the methods used for the manufacture of so-called "Silicon on Insulator" substrates, in which the objective is to make a monocrystalline silicon film supported on a substrate electrically isolated from the film. Heteroepitaxial methods can be used to grow a crystal, for example made of silicon, as a thin film on a monocrystalline substrate of another nature which has a mesh parameter similar to that of silicon. These substrates include sapphire ($Al_2O_3$), or calcium fluoride ($CaF_2$) substrates. On this subject, reference can be made to document (1) referenced at the end of this description.

The so-called "SIMOX" (Separation by IMplantation of OXygen) process uses ionic implantation with a high oxygen content in a silicon substrate to create a layer of silicon oxide in the silicon volume separating a thin film of monocrystalline silicon from the mass of the substrate. For further information, reference can be made to document (2) referenced at the end of this description which describes this process in more detail.

Other processes use the principle of thinning a wafer by mechanical-chemical or chemical abrasion; the most efficient processes in this category also use the etch-stop principle, which stops thinning of the wafer as soon as the required thickness is reached, and therefore guarantees a uniform thickness. For example, this technique consists of p type doping the n type substrate for the film thickness to be obtained, and chemically etching the substrate with a chemical bath that is active for n type silicon, and inactive for p type silicon. Reference can be made on this subject to documents (3) and (4), which are referenced at the end of this description.

The various processes of making monocrystalline thin films have disadvantages related to the manufacturing techniques.

Heteroepitaxial processes are limited by the nature of the substrate; since the substrate mesh parameter is not exactly the same as that for the semiconductor, the thin film contains a large number of crystalline defects. Moreover, these substrates are expensive and fragile, and only exist up to a limited size.

The SIMOX process requires an ionic implantation with a very high dose which requires a very heavy and complex implantation machine; the throughput of these machines is low and it is difficult to consider increasing it in significant proportions.

Thinning processes are not competitive from the point of view of uniformity and quality unless they use the etch-stop principle. Unfortunately, creation of this etch-stop makes the process complex and in some cases can limit use of the film. If the etch-stop is made by p type doping in a n type substrate, subsequent production of electronic devices in the film must be adapted to the nature of the p type film.

There is also known a process for manufacturing thin films of semiconducting material in which the thin film is formed by separating it from a substrate along a plane defined by the implantation of a layer of gaseous microblisters. This process consists of three main steps.

A first step is to bombard a semiconductor wafer with appropriate ions to form a layer of gaseous microblisters which delimit the thin layer within the volume of the wafer.

The second step consists of making the substrate surface, through which the bombardment was made, rigid by using a thick stiffener. This stiffener, made of rigid material, is designed to maintain the cohesion and shape of the thin film during the third step of the process and after its formation.

A third step consists of a heat treatment which, by the effect of crystalline rearrangement within the wafer, and by the effect of pressure in the microblisters, causes a separation between the thin film and the rest of the substrate. However, the thin film remains rigidly attached to the stiffener.

Concerning this process, it is possible to refer to document (5), which is referenced at the end of this description. This process has many advantages, and can overcome the constraints of other processes mentioned above, such as the need to use an initial substrate which is not of the same nature as the chosen semiconductor, the need for very high implantation doses, the need for an etch-stop, etc.

However, an important limitation of this process is due to the fact that the thin film can only be obtained by the use of a stiffener that will make it sufficiently rigid.

Thus, one purpose of this invention is to provide a process for the production of a thin film that is sufficiently rigid to avoid the need for a stiffener.

Another purpose is to provide a process that can be used to obtain films with a uniform and controlled thickness.

Another purpose is to provide a simple process, that can be implemented with relatively low energies.

DESCRIPTION OF THE INVENTION

In order to achieve these purposes, the object of this invention is a process for manufacturing a thin film made of a semiconductor material, comprising the following steps:

implantation of ions through a surface of a wafer of a semiconductor material, this surface being substantially parallel to a crystallographic plane in the semiconductor, to create a cleavage layer within the wafer consisting of gaseous microblisters, delimiting a surface layer within the wafer, heat treatment of the wafer at a temperature capable of causing separation of the surface layer from the rest of the wafer along the microblister layer, by a crystalline rearrangement effect and a pressure effect in the gaseous microblisters, characterized in that the implantation is carried out at an energy such that the ion penetration depth is equal to or exceeds a determined minimum depth to obtain a thin film containing said surface layer, which is sufficiently rigid so that the heat treatment can release it.

For the purposes of this invention, "gaseous microblister" refers to any cavity or micro-cavity generated by the implantation of ions of hydrogen gas or rare gases in the material. Cavities may be in a very flattened form, in other words with very low height, for example a few inter-atomic distances, or may be substantially spherical or any other shape different from these two shapes. These cavities may contain a free gaseous phase and/or atoms of gas derived from implanted ions fixed on atoms of the material forming the cavity walls. These cavities are usually referred to as "platelets", "microblisters" or even "bubbles".

Furthermore, a rigid thin film is a film whose mechanical properties are sufficient to avoid the appearance of swelling, blisters and bursting of blisters during application of the second step, and therefore to avoid that application of the second step result in separation of the entire surface. Thus, release of the thin film means complete separation of the film. This film obtained by the process according to the invention is self-supporting, in other words it is mechanically independent and can be used directly.

The wafer of semiconducting material may be monocrystalline or polycrystalline.

Furthermore, it is considered that the layer of gaseous microblisters is a cleavage layer when the implantation is carried out at a dose such that the cleavage provoked during the heat treatment causes total separation over the entire surface of the thin film. The minimum depth, which depends on the material type used to make the thin film, also corresponds to the minimum thickness of this film.

According to a particularly advantageous method of implementing the invention, it is possible to form at least one so-called "stiffning" layer on the free surface of the wafer, before the implantation step, made of a material with greater stiffness than the material of the wafer, the layer thickness being sufficient and the implantation being carried out at an energy such that ions can pass through the stiffening layer. The surface layer and the stiffening layer thus form the thin film.

The thin film is then a multi-layer film that includes the surface layer and the stiffening film layer(s). The minimum penetration depth of the implantation is always such that the thickness of the thin film, in other words of the total of these layers, has the required stiffness characteristics.

In order to make the stiffening layer, it is preferred to use materials made of light atoms, in other words with a low atomic number, for example equal to or less than 14, which have a low decelerating capacity for implanted ions.

It appears surprisingly that the process according to the invention can be implemented with relatively low energies. A judicious choice of materials allows considering implementing the process with implantation energies of less than 200 keV.

Other characteristics and advantages of this invention will become apparent from the following description with reference to the appended drawings, given for illustration purposes only and in no way restrictive.

DESCRIPTION OF EMBODIMENTS THE INVENTION

Figure 1:
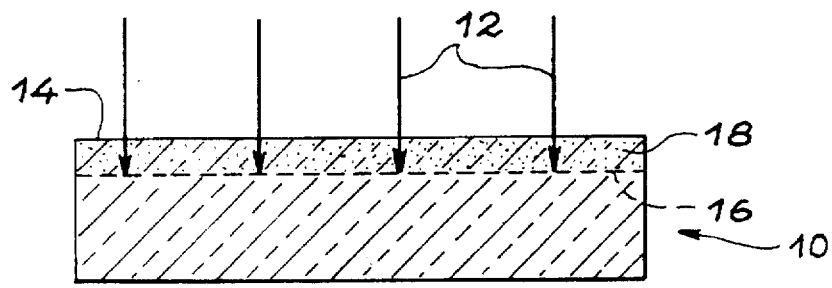
FIG. 1 schematically shows an implantation of ions in a wafer made of a semi-conducting material in accordance with a first step in the process according to the invention.

As shown in FIG. 1, which corresponds to a first implementation of the invention, the process firstly includes an implementation of ions in a wafer or an ingot 10 of monocrystalline or polycrystalline semi-conducting material.

The implantation is identified by arrows with the reference number 12. It is carried out through an upper surface 14 of the wafer 10 which is substantially parallel to a main crystallographic plane of the substrate, for example such as a (1, 0, 0) plane. Implanted ions are rare gas ions or hydrogen gas ions.

The implantation allows forming a layer of gaseous microblisters 16 within the volume of the wafer at a depth approximately equal to the average ion penetration depth. This layer of microblisters delimits a surface layer 18 within wafer 10, which will form the thin film.

It should be noted that the description of the process defined in document (5) is considered to be included in this description for information purposes.

In particular, it should be noted that during ion implantation the wafer is preferably kept at a temperature below the temperature at which the atoms of implanted gas can escape by diffusion from the semiconductor.

In accordance with the invention, implantation is carried out at an energy such that the penetration depth is equal to or greater than a minimum depth so that the film is rigid. Therefore, in order to reach at least this minimum depth, the implantation energy must exceed a threshold energy corresponding to the penetration of ions to the minimum depth.

The depth and implantation energy are related. For a given type of implanted ion, they are mainly determined by the nature of the semiconductor material used.

For example, table I below shows a correspondence between the thickness of a film to be made and the required implantation energy, in the special case of implantation of hydrogen ions in silicon.

TABLE I

| Thickness | 5 µm | 10 µm | 30 µm | 100 µm |
|---|---|---|---|---|
| Energy | 500 keV | 750 keV | 1500 keV | 3200 keV |

Table II below gives successively example values of the minimum required implantation depth for the film to be rigid, the minimum implantation dose for hydrogen ions, and the minimum implantation energy for two semiconducting materials (Si and SiC) which are particularly well adapted to implementation of the invention.

TABLE II

|  | Silicon | SiC |
|---|---|---|
| Minimum depth | 5 µm | 1.15 µm |
| Minimum Hydrogen Dose | $510^{16}$ cm$^{-2}$ | $210^{17}$ cm$^{-2}$ |
| Minimum Hydrogen Energy | 500 keV | 180 keV |

Figure 2:
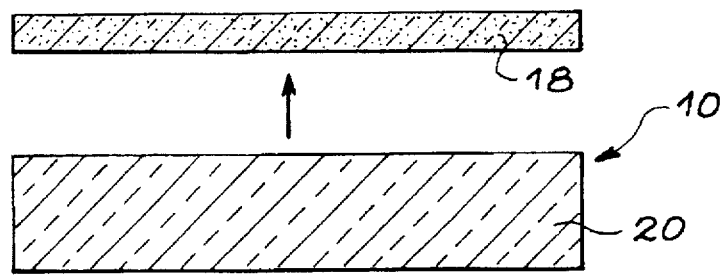
FIG. 2 schematically shows the formation of a thin film by separation of an upper layer of the wafer in accordance with a second step in the invention.

FIG. 2 shows the cleavage operation. Substrate 10 is heat treated at a temperature exceeding the temperature at which the ionic bombardment is carried out, and sufficient to create a separation of the surface layer 18 from the solid part 20 of the substrate, by crystalline rearrangement in the wafer 10 and pressure in microblisters 16 (FIG. 1).

The surface layer 18 then forms the thin film layer.

The heat treatment temperature is of the order of 500° C. if the semiconductor material used is silicon.

Figure 3:
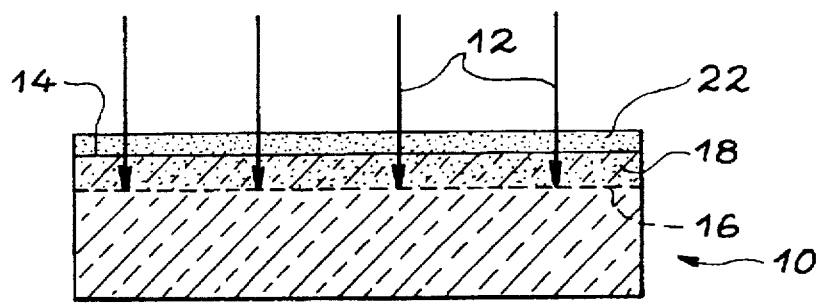
FIG. 3 shows the step for implanting ions in a wafer according to an improved implementation of this invention.
Figure 4:
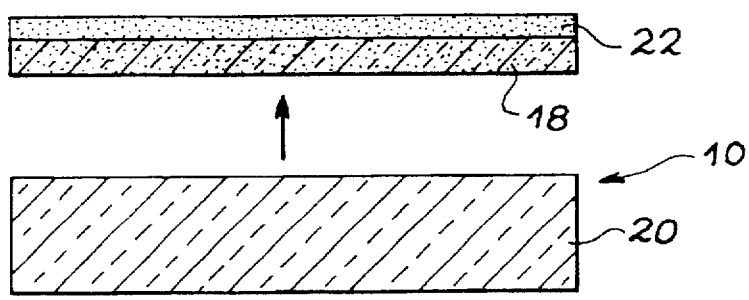
FIG. 4 shows the separation of a multi-layer thin film of the wafer according to the improved implementation of this invention.

Another implementation of the invention, which is an improvement to it, is shown in FIGS. 3 and 4. The parts of FIGS. 3 and 4 that are identical or similar to parts in FIGS. 1 and 2 have the same references, and the above description may be referred to for these parts.

As shown in FIG. 3, the surface 14 of substrate 10 is covered with a stiffening layer 22. This layer is made of a material that is preferably stiffer than the semi-conducting material in the substrate. It is further carried out before the implantation of ions 12.

It is possible to form one or a plurality of such stiffening layers on substrate 10. For example, such layer(s) may be formed by plasma enhanced chemical vapor deposition (PECVD) techniques or low pressure chemical vapor deposition (LPCVD) techniques, or by spraying or evaporation in a vacuum, or may simply be adhered onto surface 14 by an appropriate surface treatment so that an inter-atomic bond is formed after contact.

A single stiffening layer is formed in the example in FIG. 3.

It is preferably a layer made of a material composed of light atoms, which have a low capacity for deceleration of implanted ions. Diamond (Z=6) and silicon carbide (Z(C)=6, Z(Si)=14) are materials which can be deposited in layers, which can easily be crossed by ions such as hydrogen ions, and which have excellent mechanical properties. Therefore, these materials are particularly suitable for implementation of the invention. They are deposited using known methods, for example PECVD (Plasma Enhanced Chemical Vapor Deposition) or LPCVD (Low Pressure Chemical Vapor Deposition).

When the stiffening layer has been applied to substrate 10, it is bombarded with ions 12, for example hydrogen ions, in order to form a layer of gaseous microblisters 16. This layer of microblisters delimits a surface layer 18 in substrate 10. The implantation energy is chosen such that ions pass through the IS stiffening layer 14 and penetrate into the semi-conducting material. Therefore the implantation depth must exceed the thickness of the stiffening layer(s), and is always chosen such that the thin film, in other words the assembly consisting of the upper layer 18 and the stiffening layer 22, is sufficiently stiff.

When the stiffening layer itself makes the thin film sufficiently stiff, the thickness of the upper layer 18 formed in the substrate 10 may be chosen without considering the thickness.

Table III below shows the thickness of the stiffening layer that should be formed on surface 14 to obtain a rigid thin film, by way of illustration. Table III is applicable to stiffening layers made of diamond and silicon carbide (SIC). The table also shows the implantation energies necessary for hydrogen ions, so that they can pass through the stiffening layers.

TABLE III

| STIFFENING MATERIAL | DIAMOND | SiC |
| --- | --- | --- |
| Thickness | 1 μm | 1.25 μm |
| H+ Energy | ≧200 keV | ≧200 keV |

After implantation, the substrate is subjected to a heat treatment, which, as shown in FIG. 4, releases the thin film, which includes the surface layer 18 and the stiffening layer 22, from substrate 10.

DOCUMENTS MENTIONED IN THIS DESCRIPTION (1) 1986, IEEE SOS/SOI Technology Workshop, Sept. 30–Oct. 2, 1986, South seas plantation resort and yacht Harbour Captiva Island, Fla.

(2) SIMOX SOI for Integrated Circuit Fabrication by Hon Wai Lam, IEEE Circuits and Devices Magazine, July 1987.

(3) Silicon on Insulator Wafer Bonding Wafer Thinning Technological Evaluations by Haisma, Spierings, Biermann and Pals, Japanese Journal of Applied Physics, vol. 28, No. 8, August 1989.

(4) Bonding of silicon wafers for silicon on insulator, by Maszra, Goetz, Caviglia and McKitterick, Journal of Applied Physics 64 (10), Nov. 15, 1988.

(5) FR-A-2 681 472.

I claim:

1. A process for the manufacture of a thin film made of a semiconductor material, comprising the following steps:

implanting ions (12) through a surface (14) of a wafer (10) made of semi-conducting material, said surface being substantially parallel to a crystallographic plane in the semiconductor, to create a cleavage layer containing gaseous microblisters (16) in the wafer, which delimits surface layer (18) within the layer (10), the energy of the ions being such that the ion penetration depth exceeds a fixed minimum depth to obtain a thin film containing said surface layer, which is sufficiently rigid so that the subsequent heat treatment releases it; and heat treating the wafer at a temperature sufficiently high to cause separation of the surface layer (18) from the rest of the wafer, because of the effect of crystalline rearrangement and because of the pressure effect of the gaseous microblisters (16), along the layer of microblisters, wherein at least one stiffening layer (22) made of a material having a stiffness exceeding the stiffness of the material of the wafer (10), is formed on said surface (14) of the wafer before the ion implantation step, the layer of thickness and the implantation energy being such that ions pass through the stiffening layer, whereby the surface layer and the stiffening layer form the thin film, and the material of said stiffening layer (22) having an atomic number Z of ≦14.

2. The process according to claim 1, wherein the stiffening layer (22) is formed using an enhanced vapor phase chemical deposition technique.

3. The process according to claim 1, wherein the stiffening layer (22) is attached to said surface (14) of the wafer (10) by adhesion.

4. The process according to claim 1, wherein a diamond stiffening layer with a thickness of the order of 1 μm is formed, and ion implantation is carried out with an energy E such that E≧200 keV.

5. The process according to claim 1, wherein a silicon carbide stiffening layer is formed with a thickness of the order of 1.25 μm, and ion implantation is carried out with an energy E such that E≧200 keV.

6. The process according to claim 1, wherein the wafer is made of silicon or silicon carbide, respectively, and the minimum depth is 5 μm and 1.15 μm respectively.

* * * * *

UNITED STATES PATENT AND TRADEMARK OFFICE
CERTIFICATE OF CORRECTION

PATENT NO.   : 5,714,395
DATED        : February 3, 1998
INVENTOR(S)  : Michel BRUEL It is certified that error appears in the above-identified patent and that said Letters Patent is hereby corrected as shown below:

On the title page, item [75], the inventor's address should be:

--Veurey, France--

Signed and Sealed this

Ninth Day of June, 1998

Attest:

BRUCE LEHMAN

Attesting Officer

Commissioner of Patents and Trademarks